US011146232B2

(12) United States Patent
Yandrapalli et al.

(10) Patent No.: US 11,146,232 B2
(45) Date of Patent: Oct. 12, 2021

(54) TRANSVERSELY-EXCITED FILM BULK ACOUSTIC RESONATOR WITH REDUCED SPURIOUS MODES

(71) Applicant: Resonant Inc., Goleta, CA (US)

(72) Inventors: Soumya Yandrapalli, Lausanne (CH); Viktor Plesski, Gorgier (CH); Julius Koskela, Helsinki (FI); Ventsislav Yantchev, Sofia (BG); Patrick Turner, San Bruno, CA (US)

(73) Assignee: Resonant Inc., Austin, TX (US)

( * ) Notice: Subject to any disclaimer, the term of this patent is extended or adjusted under 35 U.S.C. 154(b) by 79 days.

(21) Appl. No.: 17/030,066

(22) Filed: Sep. 23, 2020

(65) Prior Publication Data

US 2021/0028757 A1    Jan. 28, 2021

Related U.S. Application Data

(63) Continuation-in-part of application No. 16/920,173, filed on Jul. 2, 2020, which is a continuation of
(Continued)

(51) Int. Cl.
*H03H 9/02* (2006.01)
*H03H 3/04* (2006.01)
(Continued)

(52) U.S. Cl.
CPC .......... *H03H 9/02228* (2013.01); *H03H 3/04* (2013.01); *H03H 9/02031* (2013.01);
(Continued)

(58) Field of Classification Search
CPC .. H03H 9/02228; H03H 3/04; H03H 9/02031; H03H 9/132; H03H 9/174;
(Continued)

(56) References Cited

U.S. PATENT DOCUMENTS 5,552,655 A * 9/1996 Stokes ............... H03H 9/02228
                                                    310/321
6,540,827 B1    4/2003 Levy et al.
(Continued)

FOREIGN PATENT DOCUMENTS

| WO | 2016017104 | 2/2016 |
| WO | 2018003273 A1 | 1/2018 |

OTHER PUBLICATIONS

Namdeo et al. "Simulation on Effects of Electrical Loading due to Interdigital Transducers in Surface Acoustic Wave Resonator", published in Procedia Engineering 64 ( 2013 ) of Science Direct pp. 322-330 (Year: 2013).*

(Continued)

*Primary Examiner* — Hafizur Rahman
(74) *Attorney, Agent, or Firm* — Socal IP Law Group LLP; John E. Gunther

(57) ABSTRACT

Acoustic filters, resonators and methods are disclosed. An acoustic resonator device includes a substrate having a surface. A back surface of a single-crystal piezoelectric plate is attached to the surface of the substrate except for a portion of the piezoelectric plate forming a diaphragm that spans a cavity in the substrate. A conductor pattern is formed on the front surface of the piezoelectric plate, the conductor pattern including an interdigital transducer (IDTs), interleaved fingers of the IDT disposed on the diaphragm. A pitch of the interleaved fingers and a mark of the interleaved fingers are set in combination such that a resonance frequency of the acoustic resonator is equal to a predetermined target frequency.

18 Claims, 11 Drawing Sheets

Related U.S. Application Data application No. 16/438,121, filed on Jun. 11, 2019, now Pat. No. 10,756,697, which is a continuation-in-part of application No. 16/230,443, filed on Dec. 21, 2018, now Pat. No. 10,491,192.

(60) Provisional application No. 62/904,386, filed on Sep. 23, 2019, provisional application No. 62/753,815, filed on Oct. 31, 2018, provisional application No. 62/748,883, filed on Oct. 22, 2018, provisional application No. 62/741,702, filed on Oct. 5, 2018, provisional application No. 62/701,363, filed on Jul. 20, 2018, provisional application No. 62/685,825, filed on Jun. 15, 2018.

(51) Int. Cl.
*H03H 9/13* (2006.01)
*H03H 9/17* (2006.01)
*H03H 9/56* (2006.01)
*H03H 3/02* (2006.01)

(52) U.S. Cl.
CPC ............ *H03H 9/132* (2013.01); *H03H 9/174* (2013.01); *H03H 9/176* (2013.01); *H03H 9/562* (2013.01); *H03H 9/564* (2013.01); *H03H 9/568* (2013.01); *H03H 2003/023* (2013.01); *H03H 2003/0442* (2013.01)

(58) Field of Classification Search
CPC ........ H03H 9/176; H03H 9/562; H03H 9/564; H03H 9/568; H03H 2003/023; H03H 2003/0442
USPC .......................................... 333/186, 187, 189
See application file for complete search history.

(56) References Cited

U.S. PATENT DOCUMENTS

| | | | |
|---|---|---|---|
| 7,463,118 B2 | 12/2008 | Jacobsen | |
| 7,535,152 B2 | 5/2009 | Ogami et al. | |
| 7,684,109 B2 | 3/2010 | Godshalk et al. | |
| 7,728,483 B2 * | 6/2010 | Tanaka ............... | H03H 9/02023 310/313 R |
| 7,868,519 B2 | 1/2011 | Umeda | |
| 8,278,802 B1 | 10/2012 | Lee et al. | |
| 8,829,766 B2 | 9/2014 | Milyutin et al. | |
| 8,932,686 B2 | 1/2015 | Hayakawa et al. | |
| 9,219,466 B2 | 12/2015 | Meltaus et al. | |
| 9,276,557 B1 | 3/2016 | Nordquist et al. | |
| 9,369,105 B1 | 6/2016 | Li | |
| 9,425,765 B2 | 8/2016 | Rinaldi | |
| 9,525,398 B1 | 12/2016 | Olsson | |
| 9,780,759 B2 | 10/2017 | Kimura et al. | |
| 2002/0158714 A1 | 10/2002 | Kaitila et al. | |
| 2004/0261250 A1 | 12/2004 | Kadota et al. | |
| 2005/0185026 A1 * | 8/2005 | Noguchi ............... | C04B 35/499 347/68 |
| 2011/0109196 A1 | 5/2011 | Goto | |
| 2013/0234805 A1 | 9/2013 | Takahashi | |
| 2014/0145556 A1 | 5/2014 | Kadota | |
| 2014/0151151 A1 | 6/2014 | Reinhardt | |
| 2015/0319537 A1 | 11/2015 | Perois et al. | |
| 2015/0333730 A1 | 11/2015 | Meltaus | |
| 2016/0182009 A1 | 6/2016 | Bhattacharjee | |
| 2017/0063332 A1 | 3/2017 | Gilbert et al. | |
| 2017/0179928 A1 | 6/2017 | Raihn et al. | |
| 2017/0214387 A1 | 7/2017 | Burak et al. | |
| 2017/0222622 A1 | 8/2017 | Solal et al. | |
| 2019/0068164 A1 | 2/2019 | Houlden et al. | |
| 2019/0131953 A1 | 5/2019 | Gong | |
| 2019/0273480 A1 | 9/2019 | Lin | |

OTHER PUBLICATIONS

Rodríguez-Madrid et al., "Super-High-Frequency SAW Resonators on AIN/Diamond", IEEE Electron Device Letters, vol. 33, No. 4, Apr. 2012, pp. 495-497. (Year: 2012).*

Santosh G, Surface acoustic wave devices on silicon using patterned and thin film ZnO, Ph.D. thesis, Indian Institute of technology Guwahati, Assam, India, Feb. 2016, p. 50 added (Year: 2016).*

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 GHz Lithium Niobate MEMS Resonators With High FOM of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A.. (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Y-cut X-propagation LiNbO3 plates." Electron. Comm. Jpn. Pt. I, 69, No. 4 (1986): 47-55. doi:10.1002/ecja.4410690406.

Naumenko et al., "Optimal orientations of Lithium Niobate for resonator SAW filters", 2003 IEEE Ultrasonics Symposium—pp. 2110-2113. (Year: 2003).

* cited by examiner

US 11,146,232 B2

TRANSVERSELY-EXCITED FILM BULK ACOUSTIC RESONATOR WITH REDUCED SPURIOUS MODES

RELATED APPLICATION INFORMATION

This patent claims priority from provisional patent application 62/904,386, filed Sep. 23, 2019, entitled ANALYSIS OF XBAR RESONANCE AND HIGHER ORDER SPURIOUS MODES.

This patent is also a continuation-in-part of application Ser. No. 16/920,173, filed Jul. 2, 2020, entitled TRANSVERSELY-EXCITED FILM BULK ACOUSTIC RESONATOR, which is a continuation of application Ser. No. 16/438,121, filed Jun. 11, 2019, entitled TRANSVERSELY-EXCITED FILM BULK ACOUSTIC RESONATOR, now U.S. Pat. No. 10,756,697, which is a continuation-in-part of application Ser. No. 16/230,443, filed Dec. 21, 2018, entitled TRANSVERSELY-EXCITED FILM BULK ACOUSTIC RESONATOR, now U.S. Pat. No. 10,491,192 B2, which claims priority from the following provisional patent applications: application 62/685,825, filed Jun. 15, 2018, entitled SHEAR-MODE FBAR (XBAR); application 62/701,363, filed Jul. 20, 2018, entitled SHEAR-MODE FBAR (XBAR); application 62/741,702, filed Oct. 5, 2018, entitled 5 GHZ LATERALLY-EXCITED BULK WAVE RESONATOR (XBAR); application 62/748,883, filed Oct. 22, 2018, entitled SHEAR-MODE FILM BULK ACOUSTIC RESONATOR; and application 62/753,815, filed Oct. 31, 2018, entitled LITHIUM TANTALATE SHEAR-MODE FILM BULK ACOUSTIC RESONATOR. All of these applications are incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

The desire for wider communication channel bandwidths will inevitably lead to the use of higher frequency communications bands. The current LTE™ (Long Term Evolution) specification defines frequency bands from 3.3 GHz to 5.9 GHz. These bands are not presently used. Future proposals for wireless communications include millimeter wave communication bands with frequencies up to 28 GHz.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies proposed for future communications networks.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
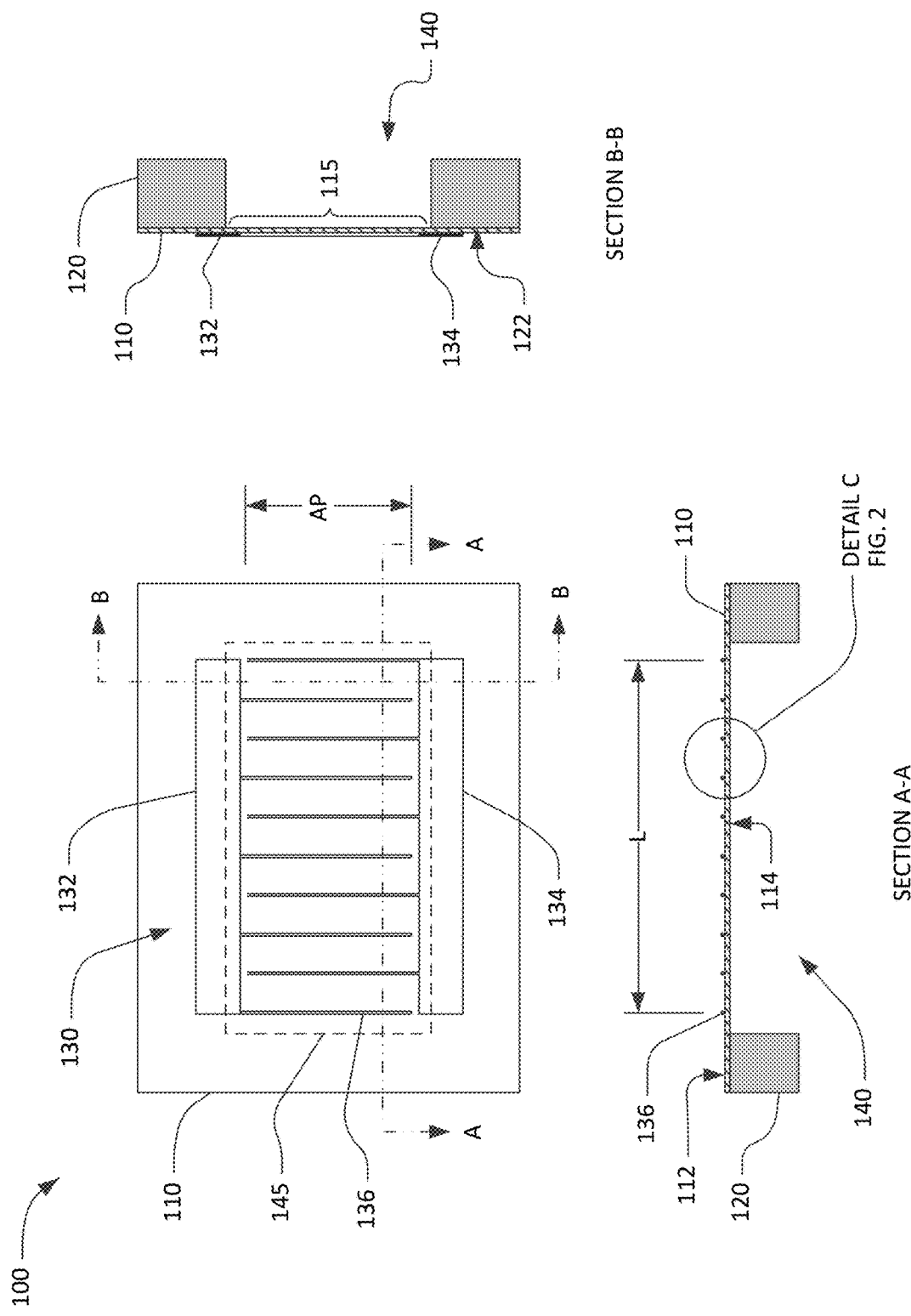
FIG. 1 has a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are well suited for use in filters for communications bands with frequencies above 3 GHz.

The XBAR 100 is made up of a thin film conductor pattern formed on a surface of a piezoelectric plate 110 having a front surface 112 and a back surface 114. The front and back surfaces are essentially parallel. "Essentially parallel" means parallel to the extent possible within normal manufacturing tolerances. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the front surface 112 and back surface 114. However, XBARs may be fabricated on piezoelectric plates with other crystallographic orientations including rotated Z-cut and rotated YX-cut.

The back surface 114 of the piezoelectric plate 110 is attached to a surface 122 of the substrate 120 except for a portion of the piezoelectric plate 110 that forms a diaphragm 115 spanning a cavity 140 formed in the substrate 120. The cavity 140 has a perimeter defined by the intersection of the cavity and the surface 122 of the substrate 120. The portion of the piezoelectric plate that spans the cavity is referred to herein as the "diaphragm" due to its physical resemblance to the diaphragm of a microphone. As shown in FIG. 1, the diaphragm 115 is contiguous with the rest of the piezoelectric plate 110 around all of the perimeter 145 of the cavity 140. In this context, "contiguous" means "continuously connected without any intervening item".

The substrate 120 provides mechanical support to the piezoelectric plate 110. The substrate 120 may be, for example, silicon, sapphire, quartz, or some other material or combination of materials. The back surface 114 of the piezoelectric plate 110 may be attached to the substrate 120 using a wafer bonding process. Alternatively, the piezoelectric plate 110 may be grown on the substrate 120 or otherwise attached to the substrate. The piezoelectric plate 110 may be attached directly to the substrate or may be attached to the substrate 120 via one or more intermediate material layers.

The cavity 140 is an empty space within a solid body of the resonator 100. The cavity 140 may be a hole completely through the substrate 120 (as shown in Section A-A and Section B-B) or a recess in the substrate 120 (as shown subsequently in FIG. 3). The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. An IDT is an electrode structure for converting between electrical and acoustic energy in piezoelectric devices. The IDT 130 includes a first plurality of parallel elongated conductors, commonly called "fingers", such as finger 136, extending from a first busbar 132. The IDT 130 includes a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The term "busbar" refers to the conductors that interconnect the first and second sets of fingers in an IDT. As shown in FIG. 1, each busbar 132, 134 is an elongated rectangular conductor with a long axis orthogonal to the interleaved fingers and having a length approximately equal to the length L of the IDT. The busbars of an IDT need not be rectangular or orthogonal to the interleaved fingers and may have lengths longer than the length of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 of the piezoelectric plate that spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. An XBAR for a 5G device will have more than ten parallel fingers in the IDT 110. An XBAR may have hundreds, possibly thousands, of parallel fingers in the IDT 110. Similarly, the thickness of the fingers in the cross-sectional views is greatly exaggerated in the drawings.

Figure 2:
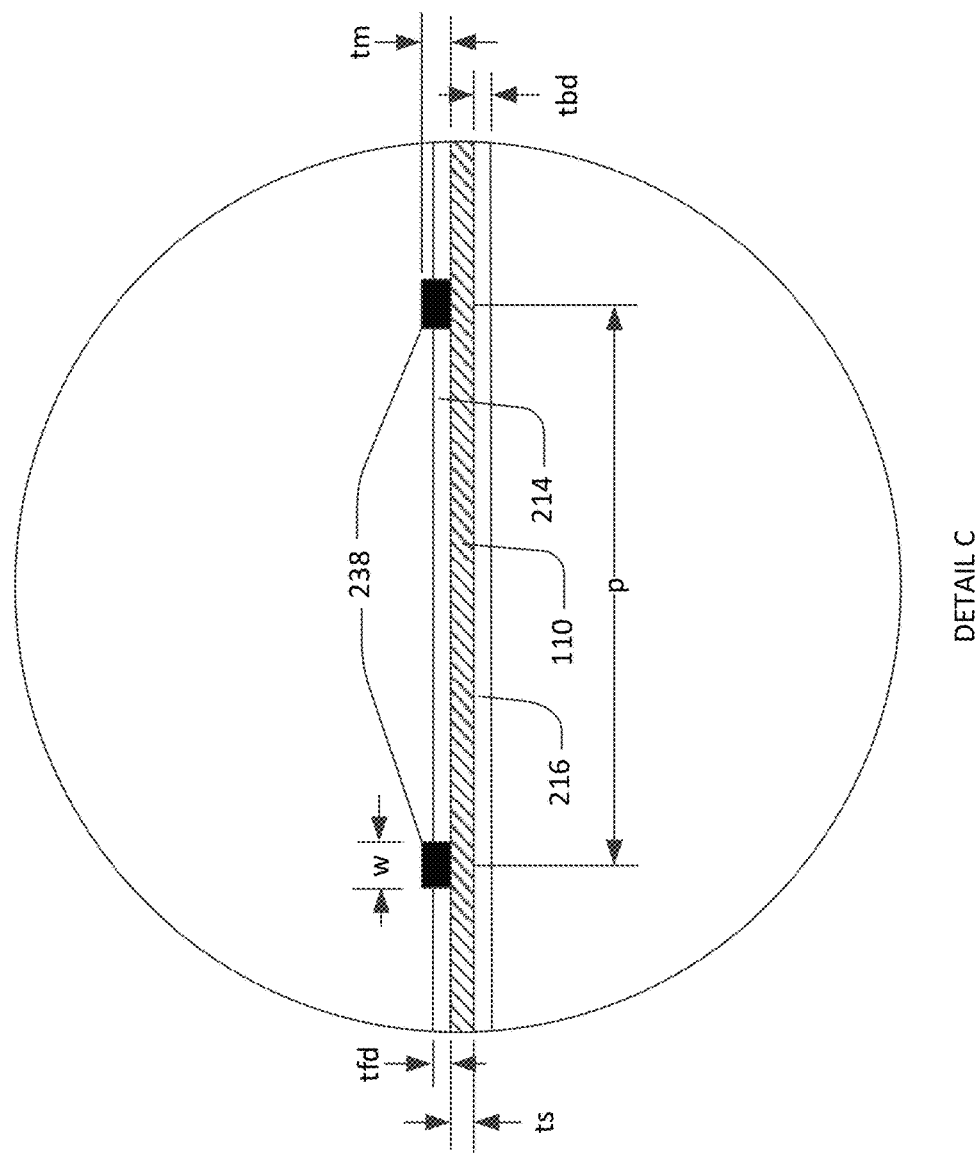
FIG. 2 is an expanded schematic cross-sectional view of a portion of the XBAR of FIG. 1.

FIG. 2 shows a detailed schematic cross-sectional view of the XBAR 100. The piezoelectric plate 110 is a single-crystal layer of piezoelectrical material having a thickness ts. ts may be, for example, 100 nm to 1500 nm. When used in filters for LTE™ bands from 3.4 GHZ to 6 GHz (e.g. bands 42, 43, 46), the thickness ts may be, for example, 200 nm to 1000 nm.

A front-side dielectric layer 214 may be formed on the front side of the piezoelectric plate 110. The "front side" of the XBAR is the surface facing away from the substrate. The front-side dielectric layer 214 has a thickness tfd. The front-side dielectric layer 214 is formed between the IDT fingers 238. Although not shown in FIG. 2, the front side dielectric layer 214 may also be deposited over the IDT fingers 238. A back-side dielectric layer 216 may be formed on the back side of the piezoelectric plate 110. The back-side dielectric layer 216 has a thickness tbd. The front-side and back-side dielectric layers 214, 216 may be a non-piezoelectric dielectric material, such as silicon dioxide or silicon nitride. tfd and tbd may be, for example, 0 to 500 nm. tfd and tbd are typically less than the thickness ts of the piezoelectric plate. tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The IDT fingers 238 may be one or more layers of aluminum, a substantially aluminum alloys, copper, a substantially copper alloys, beryllium, gold, molybdenum, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers. As shown in FIG. 2, the IDT fingers 238 have rectangular cross-sections. The IDT fingers may have some other cross-sectional shape, such as trapezoidal.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e., the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness ts of the piezoelectric slab 212. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3:
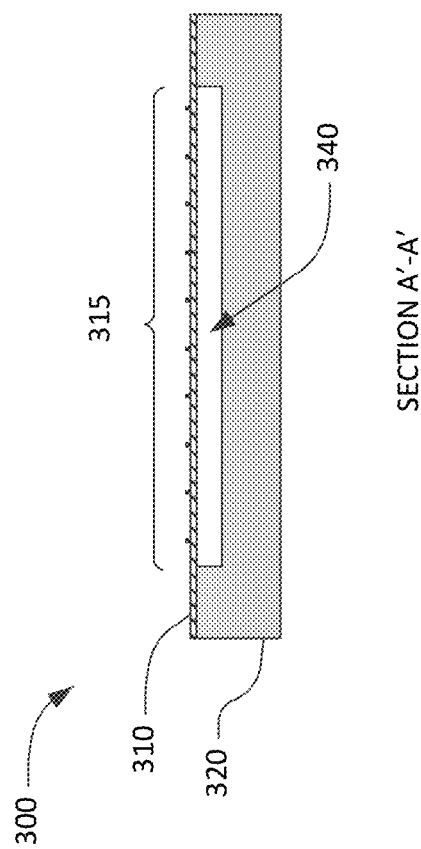
FIG. 3 is an alternative schematic cross-sectional view of the XBAR of FIG. 1.

FIG. 3 is a plan view and a cross-sectional view of another XBAR 300 which is similar to the XBAR 100 of FIG. 1. A piezoelectric plate 310 is attached to a substrate 320. A portion of the piezoelectric plate 310 forms a diaphragm 315 spanning a cavity 340 in the substrate 320. An IDT 330 is formed on the surface 312 of the piezoelectric plate as previously described.

Unlike the cavity 140 of FIG. 1, the cavity 340 does not fully penetrate the substrate 320. The cavity 340 may be formed, for example, by etching the substrate 320 before attaching the piezoelectric plate 310. Alternatively, the cavity 340 may be formed by etching the substrate 320 with a selective etchant that reaches the substrate through one or more openings, such as opening 350, provided in the piezoelectric plate 310. In this case, the diaphragm 315 may be contiguous with the rest of the piezoelectric plate 310 around a large portion of a perimeter 345 of the cavity 340. For example, the diaphragm 315 may be contiguous with the rest of the piezoelectric plate 310 around at least 50% of the perimeter 345 of the cavity 340.

Figure 4:
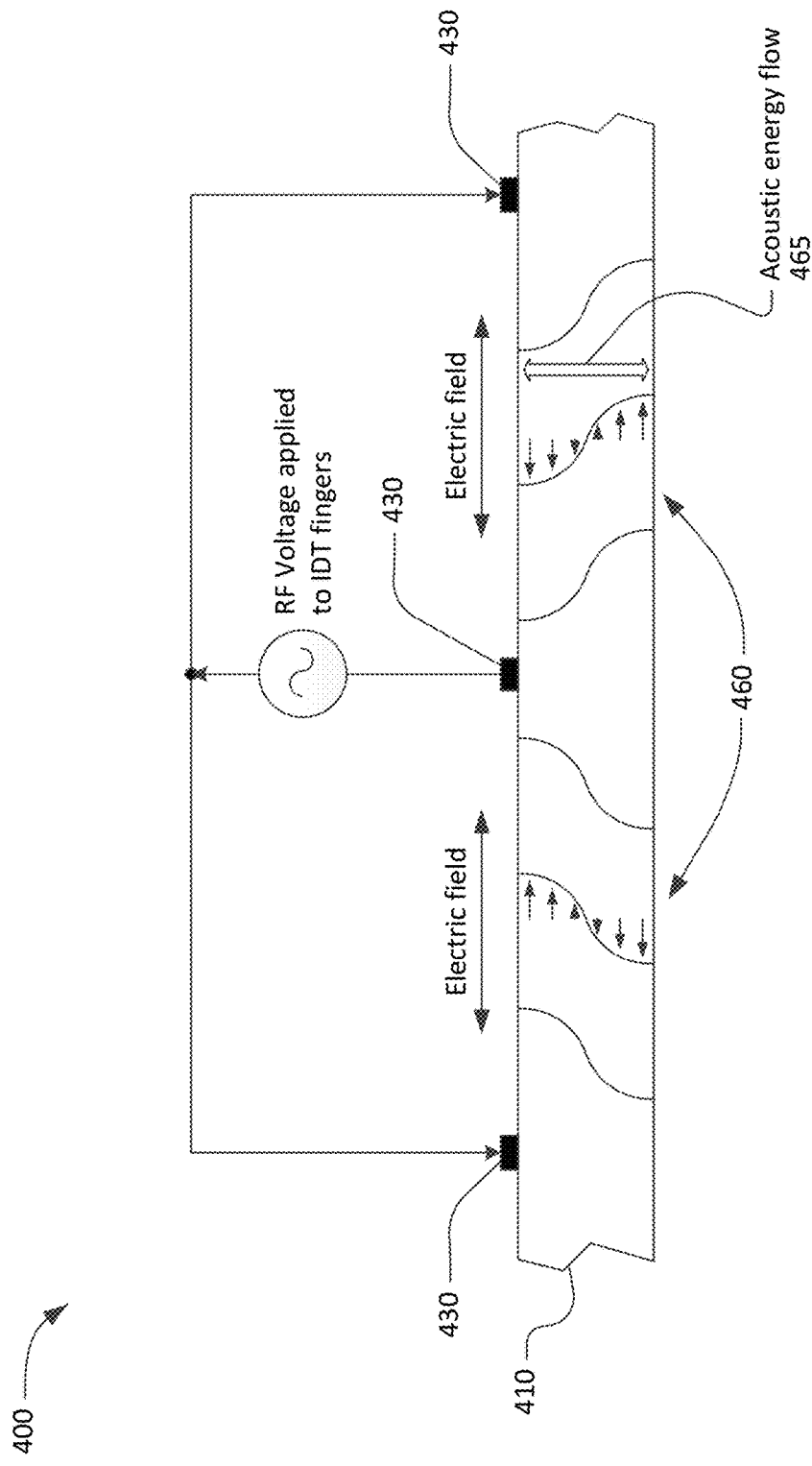
FIG. 4 is a graphic illustrating a shear primary acoustic mode in an XBAR.

FIG. 4 is a graphical illustration of the primary acoustic mode of interest in an XBAR. FIG. 4 shows a small portion of an XBAR 400 including a piezoelectric plate 410 and three interleaved IDT fingers 430. A radio frequency (RF) voltage is applied to the interleaved fingers 430. This voltage creates a time-varying electric field between the fingers. The direction of the electric field is primarily lateral, or parallel to the surface of the piezoelectric plate 410, as indicated by the arrows labeled "electric field". Since the dielectric constant of the piezoelectric plate is significantly higher than the surrounding air, the electric field is highly concentrated in the plate relative to the air. The lateral electric field introduces shear deformation, and thus strongly excites a shear-mode acoustic mode, in the piezoelectric plate 410. Shear deformation is deformation in which parallel planes in a material remain parallel and maintain a constant distance while translating relative to each other. A "shear acoustic mode" is an acoustic vibration mode in a medium that results in shear deformation of the medium. The shear deformations in the XBAR 400 are represented by the curves 460, with the adjacent small arrows providing a schematic indication of the direction and magnitude of atomic motion. The degree of atomic motion, as well as the thickness of the piezoelectric plate 410, have been greatly exaggerated for ease of visualization. While the atomic motions are predominantly lateral (i.e. horizontal as shown in FIG. 4), the direction of acoustic energy flow of the excited primary shear acoustic mode is substantially orthogonal to the surface of the piezoelectric plate, as indicated by the arrow 465.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. High piezoelectric coupling enables the design and implementation of microwave and millimeter-wave filters with appreciable bandwidth.

Figure 5:
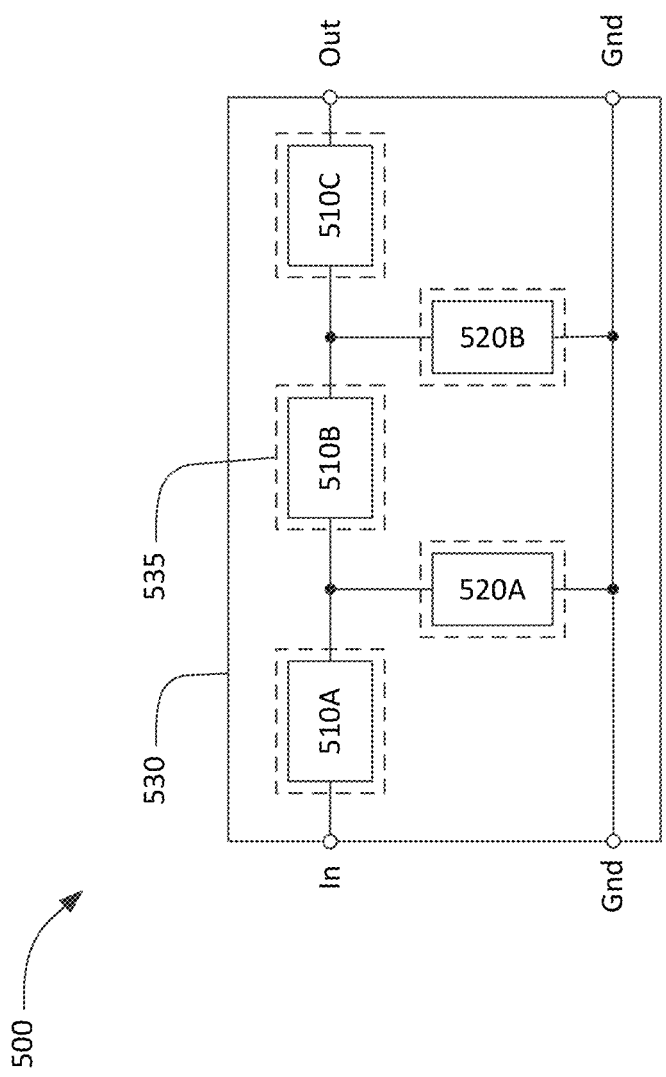
FIG. 5 is a schematic block diagram of a filter using XBARs.

FIG. 5 is a schematic circuit diagram and layout for a high frequency band-pass filter 500 using XBARs. The filter 500 has a conventional ladder filter architecture including three series resonators 510A, 510B, 510C and two shunt resonators 520A, 520B. The three series resonators 510A, 510B, and 510C are connected in series between a first port and a second port (hence the term "series resonator"). In FIG. 5, the first and second ports are labeled "In" and "Out", respectively. However, the filter 500 is bidirectional and either port may serve as the input or output of the filter. The two shunt resonators 520A, 520B are connected from nodes between the series resonators to ground. A filter may contain additional reactive components, such as inductors, not shown in FIG. 5. All the shunt resonators and series resonators are XBARs. The inclusion of three series and two shunt resonators is exemplary. A filter may have more or fewer than five total resonators, more or fewer than three series resonators, and more or fewer than two shunt resonators. Typically, all of the series resonators are connected in series between an input and an output of the filter. All of the shunt resonators are typically connected between ground and the input, the output, or a node between two series resonators.

In the exemplary filter 500, the three series resonators 510A, B, C and the two shunt resonators 520A, B of the filter 500 are formed on a single plate 530 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 5, the cavities are illustrated schematically as the dashed rectangles (such as the rectangle 535). In this example, each IDT is disposed over a respective cavity. In other filters, the IDTs of two or more resonators may be disposed over a single cavity.

Each of the resonators 510A, 510B, 510C, 520A, 520B in the filter 500 has resonance where the admittance of the resonator is very high and an anti-resonance where the admittance of the resonator is very low. The resonance and anti-resonance occur at a resonance frequency and an anti-resonance frequency, respectively, which may be the same or different for the various resonators in the filter 500. In over-simplified terms, each resonator can be considered a short-circuit at its resonance frequency and an open circuit at its anti-resonance frequency. The input-output transfer function will be near zero at the resonance frequencies of the shunt resonators and at the anti-resonance frequencies of the series resonators. In a typical filter, the resonance frequencies of the shunt resonators are positioned below the lower edge of the filter's passband and the anti-resonance frequencies of the series resonators are positioned above the upper edge of the passband.

Figure 6:
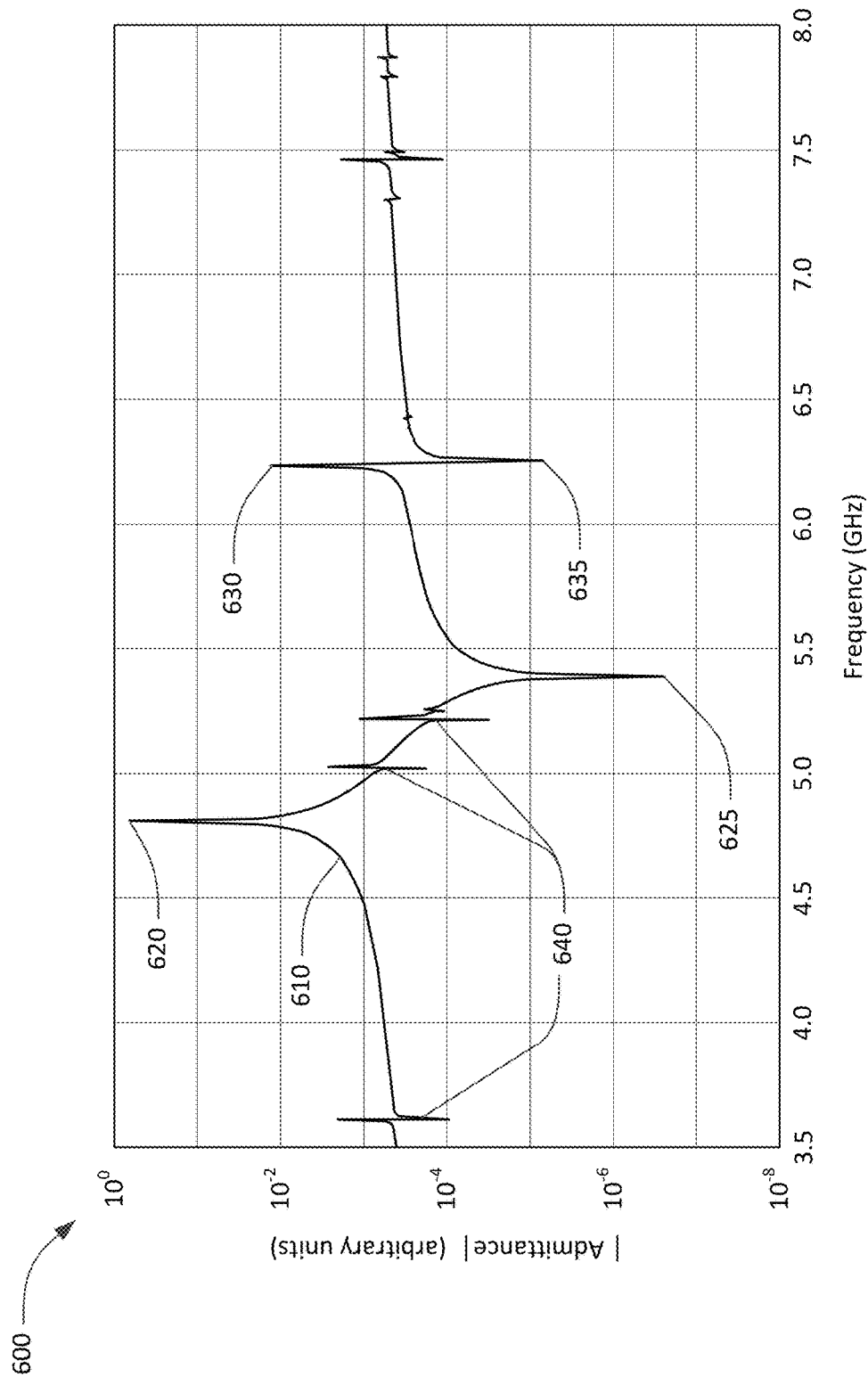
FIG. 6 is a graph of the magnitude of admittance versus frequency for an XBAR.

FIG. 6 is a graph 600 of the performance of a typical XBAR. The curve 610 is a plot of the magnitude of the admittance of an XBAR device having a lithium niobate diaphragm. The diaphragm thickness is 400 nm. The IDT conductors are aluminum, 100 nm thick. The IDT pitch is 3 µm and the IDT mark or finger width is 500 nm. The primary shear acoustic mode has a resonance 620 at a frequency of 4.8 GHz and an anti-resonance 625 at a frequency about 5.4 GHz. The coupling of the primary mode is greater than 25% and the Q at the resonance and anti-resonance frequencies is 400 to 500.

The solid curve 610 also exhibits multiple spurious modes. The largest spurious mode is an A1-3 mode (the third harmonic of the primary shear acoustic mode) with a resonance 630 and anti-resonance 635 at about 6.25 GHz. Small spurious modes 640 are high order harmonics of plate wave modes that travel along the length of the XBAR in a direction normal to the IDT fingers. Data presented in FIG. 6 and subsequent figures is derived from two-dimensional simulation of XBARs using a finite-element technique.

Figure 7:
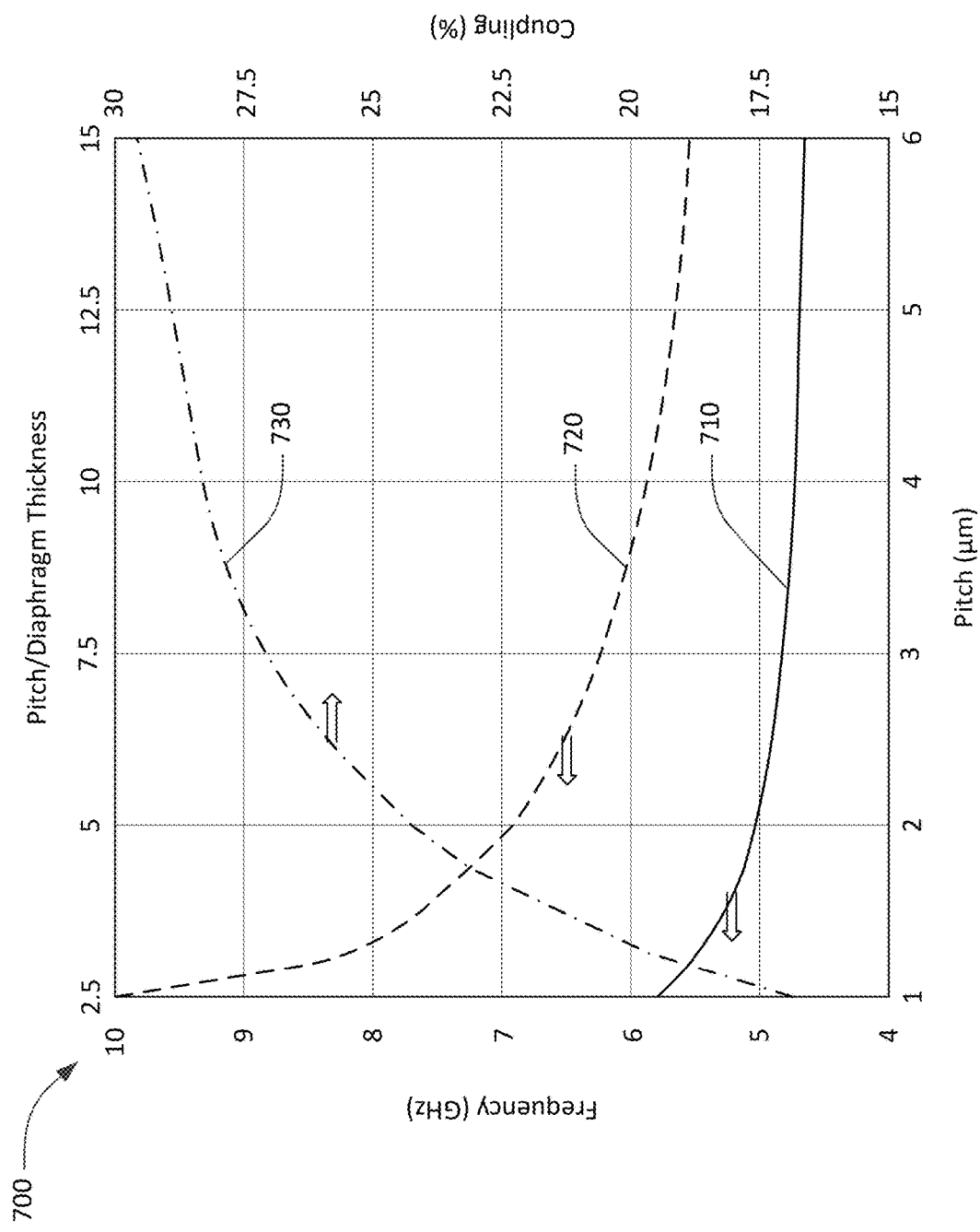
FIG. 7 is a graph of the frequency and coupling of a primary shear mode and the frequency of an A1-3 spurious mode as functions of interdigital transducer (IDT) pitch.

FIG. 7 is a graph 700 of relationships between XBAR performance and IDT pitch. The solid curve 710 is a plot of the resonance frequency of the XBAR shear primary mode as a function of IDT pitch for an XBAR with a z-cut lithium niobate diaphragm 400 nm thick and aluminum conductors 100 nm thick. The diaphragm thickness is the dominant parameter that determines resonance frequency of an XBAR. The resonance frequency has a smaller dependence on IDT pitch. As shown in FIG. 7, varying the IDT pitch from 1 µm to 6 µm results in reduction in resonance frequency by about 25%.

The dashed curve 720 is a plot of the resonance frequency of the A1-3 spurious mode of the same XBAR as a function of IDT pitch. Diaphragm thickness is also the dominant parameter that determines resonance frequency of A1-3 mode. However, the resonance frequency of the A1-3 mode has a much larger dependence on IDT pitch compared to the shear primary mode. Varying the IDT pitch from 1 µm to 6 µm results in reduction in resonance frequency of the A1-4 mode by about 85%. The frequencies of other spurious modes (i.e. spurious modes 640 in FIG. 6) are also very dependent on IDT pitch.

The dot-dash curve 730 is a plot of electromechanical coupling of the shear primary mode as a function of IDT pitch. The relationship between coupling and pitch is nonlinear. Larger IDT pitch results in higher coupling and coupling decreases rapidly for pitch values less than 3 µm. However, 17% coupling is available at pitch value of 1 µm, which is still sufficient for many filter applications.

Figure 8:
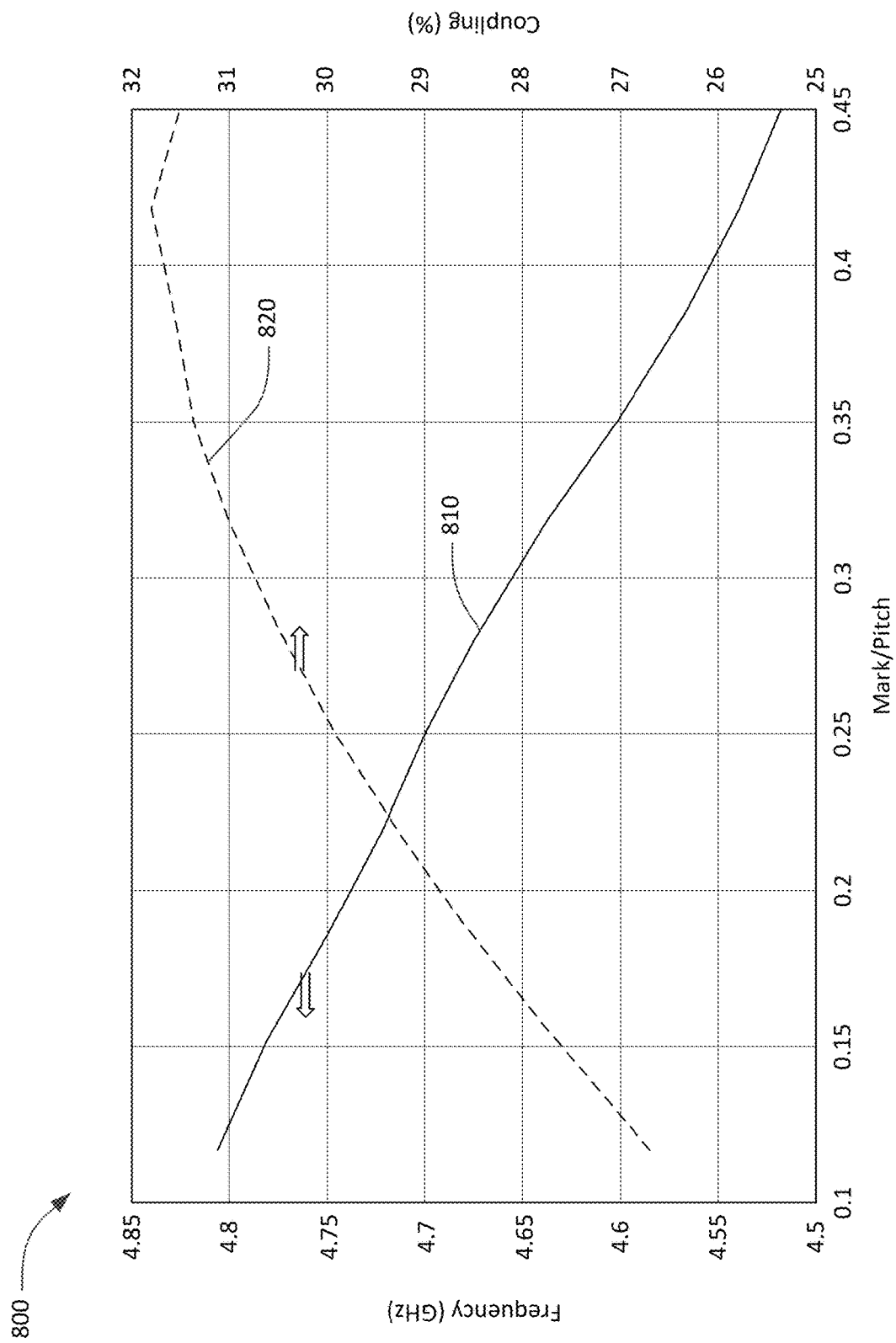
FIG. 8 is a graph of the frequency and coupling of the A1-3 spurious mode as functions of IDT mark-to-pitch ratio.

FIG. 8 is a graph 800 of relationships between XBAR performance and IDT mark-to-pitch ratio (mark/pitch). The solid curve 810 is a plot of the resonance frequency of the XBAR shear primary mode as a function of IDT mark/pitch for an XBAR with a z-cut lithium niobate diaphragm 400 nm thick. The IDT conductors are aluminum 100 nm thick and the IDT pitch is 3 µm. The diaphragm thickness is the dominant parameter that determines resonance frequency of an XBAR. The resonance frequency has a smaller dependence on IDT mark/pitch. As shown in FIG. 8, varying the IDT mark/pitch from 0.15 to 0.45 µm results in reduction in resonance frequency by about 6%.

The dashed curve 820 is a plot of electromechanical coupling of the shear primary mode as a function of IDT mark/pitch. The relationship between coupling and mark/pitch is nonlinear. Maximum coupling occurs for IDT mark/pitch between 0.40 and 0.45. Coupling decreases with decreasing mark/pitch. However, 27% coupling is available at mark/pitch value of about 0.12, which is sufficient for most filter applications.

FIG. 7 and FIG. 8 illustrate the complexity of selecting the pitch and mark of XBAR IDTs within a filter to provide a desired resonance frequency and electromechanical coupling of each XBAR while trying to place spurious modes at frequencies that do not degrade the filter performance. In particular, since the resonance frequency of the shear primary acoustic mode varies with both IDT pitch and IDT mark, the pitch and mark must be selected in combination to set the resonance frequency of an XBAR to a predetermined target frequency. Since the same resonance frequency may be achieved with different IDT pitch and mark combinations, a filter designer has some freedom to select the pitch and mark to control the frequencies of spurious modes.

Figure 9:
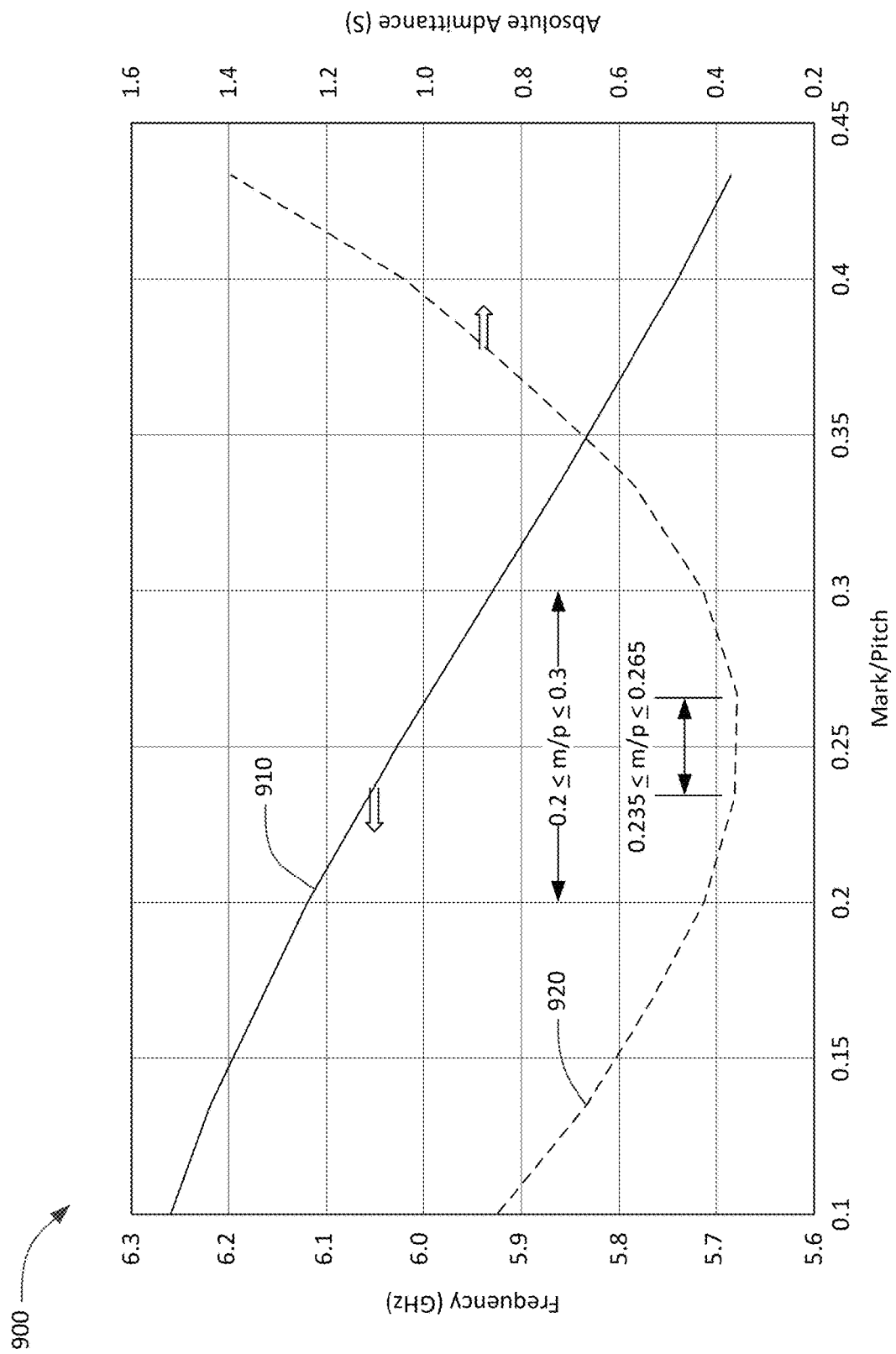
FIG. 9 is a graph of absolute admittance and frequency of the A1-3 spurious mode as functions of IDT mark-to-pitch ratio.

FIG. 9 is a graph 900 of relationships between the A1-3 spurious mode and IDT mark-to-pitch ratio (mark/pitch). The solid curve 910 is a plot of the resonance frequency of the A1-3 mode as a function of IDT mark/pitch for an XBAR with a z-cut lithium niobate diaphragm 400 nm thick. The IDT conductors are aluminum 100 nm thick and the IDT pitch is 3 µm. The A1-3 mode resonance frequency depends on IDT mark/pitch. As shown in FIG. 9, varying the IDT mark/pitch from 0.15 to 0.45 µm results in reduction in resonance frequency by about 10%.

The dashed curve 920 is a plot of the absolute admittance of the A1-3 mode as a function of IDT mark/pitch. The relationship between admittance and mark/pitch is nonlinear. Minimum admittance occurs for IDT mark/pitch from 0.235 to 0.265. Admittance increase for mark/pitch values outside of this range but is still small for a mark/pitch range from 0.2 to 0.3.

Figure 10:
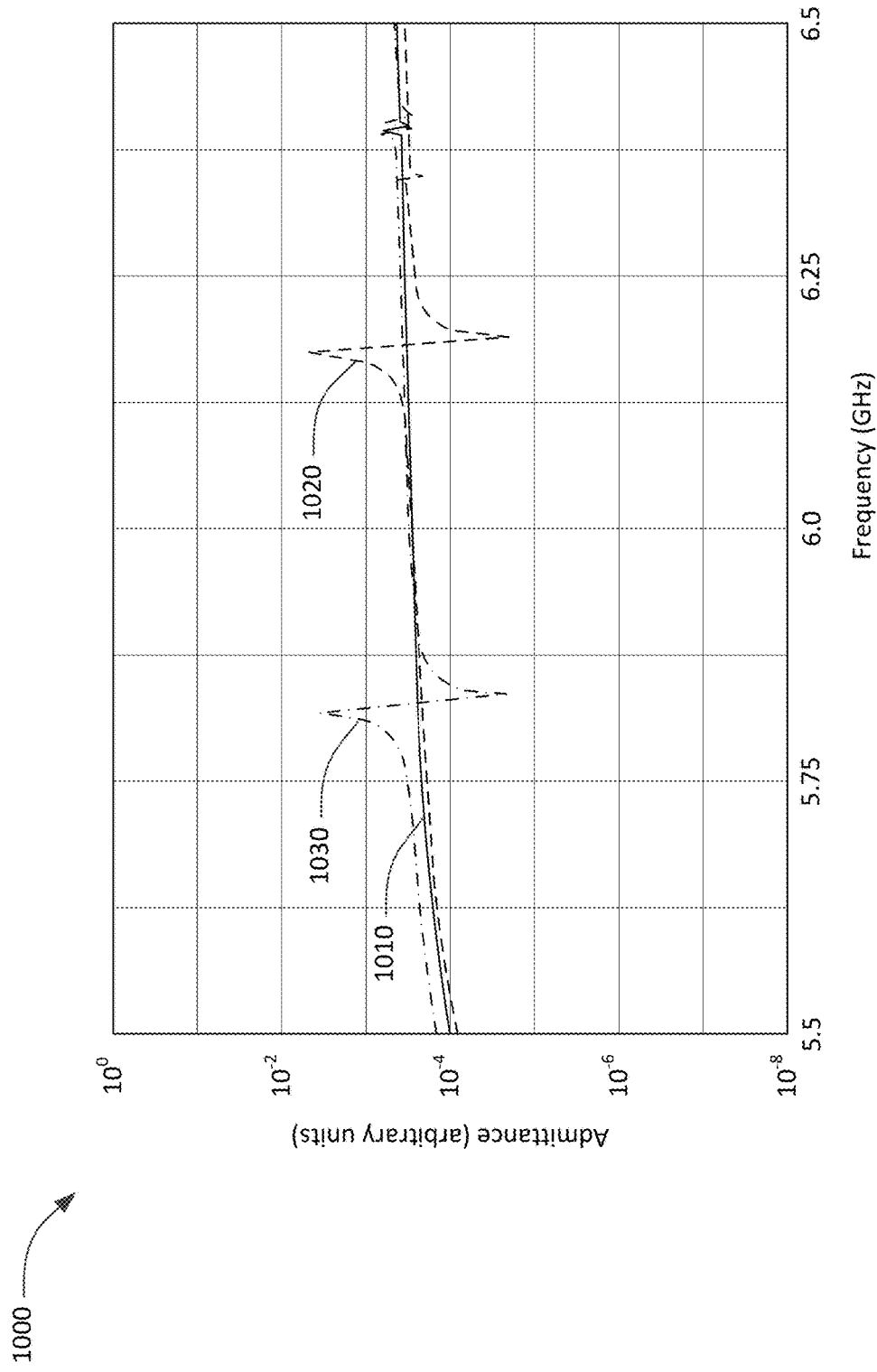
FIG. 10 is a graph of the magnitude of admittance versus frequency for three XBARs with different mark-to-pitch ratios.

FIG. 10 is a graph 1000 of the performance of three XBARs having different mark/pitch ratios. Specifically, the solid line 1010 is a plot of the magnitude of admittance of an XBAR with m/p=0.25. The dashed line 1020 is a plot of the magnitude of admittance of an XBAR with m/p=0.2. The dot-dash line 1030 is a plot of the magnitude of admittance of an XBAR with m/p=0.3. All three XBARs have z-cut lithium niobate diaphragms 400 nm thick. The IDT conductors are aluminum 100 nm thick and the IDT pitch is 3 μm. An A1-3 mode is present for the XBARs with m/p=0.2 and m/p=0.3. The A1-3 mode is not present in the XBAR with m/p=0.25 (solid line 1010).

FIG. 9 and FIG. 10 demonstrate that selecting IDT mark/pitch in a range from 0.2 to 0.3, or in a preferred range of 0.235 to 0.265, reduces or eliminates the A1-3 spurious mode. It is anticipated that this range will be valid for values of IDT pitch greater than or less than 3 μm and for thin aluminum IDT conductors with a thickness between 50 nm and 150 nm.

Description of Methods

Figure 11:
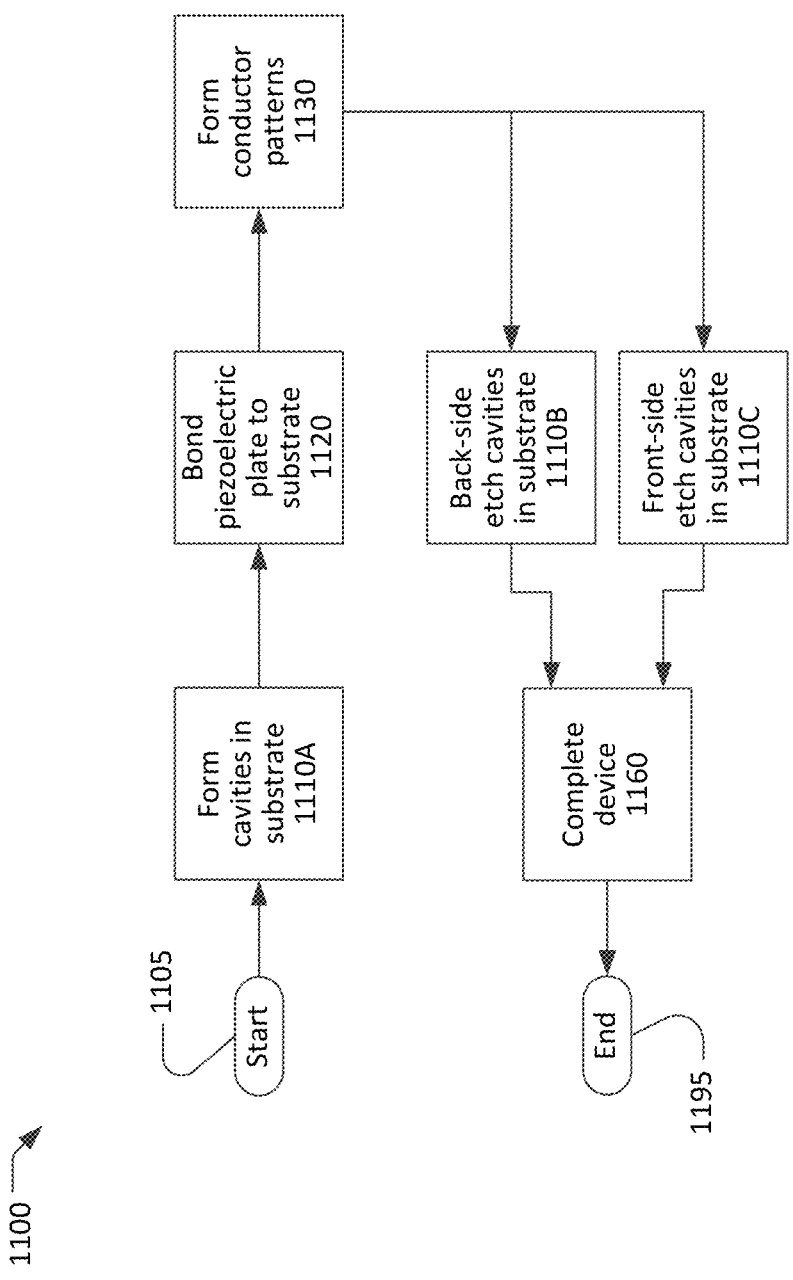
FIG. 11 is a flow chart of a process for fabricating an XBAR or filter incorporating XBARs.

FIG. 11 is a simplified flow chart showing a process 1100 for making an XBAR or a filter incorporating XBARs. The process 1100 starts at 1105 with a substrate and a plate of piezoelectric material and ends at 1195 with a completed XBAR or filter. The flow chart of FIG. 11 includes only major process steps. Various conventional process steps (e.g. surface preparation, cleaning, inspection, baking, annealing, monitoring, testing, etc.) may be performed before, between, after, and during the steps shown in FIG. 11.

The flow chart of FIG. 11 captures three variations of the process 1100 for making an XBAR which differ in when and how cavities are formed in the substrate. The cavities may be formed at steps 1110A, 1110B, or 1110C. Only one of these steps is performed in each of the three variations of the process 1100.

The piezoelectric plate may be, for example, Z-cut lithium niobate as used in the previously presented examples. The piezoelectric plate may be rotated ZY-lithium niobate or rotated YX-cut lithium niobate. The piezoelectric plate may be some other material and/or some other cut. The substrate may preferably be silicon. The substrate may be some other material that allows formation of deep cavities by etching or other processing.

In one variation of the process 1100, one or more cavities are formed in the substrate at 1110A before the piezoelectric plate is bonded to the substrate at 1120. A separate cavity may be formed for each resonator in a filter device. The one or more cavities may be formed using conventional photolithographic and etching techniques. Typically, the cavities formed at 1110A will not penetrate through the substrate, and the resulting resonator devices will have a cross-section as shown in FIG. 3.

At 1120, the piezoelectric plate is bonded to the substrate. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

A conductor pattern, including IDTs of each XBAR, is formed at 1130 by depositing and patterning one or more conductor layers on the front side of the piezoelectric plate. The conductor layer may be, for example, aluminum or an aluminum alloy with a thickness of 50 nm to 150 nm. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the conductor pattern (for example the IDT bus bars and interconnections between the IDTs).

The conductor pattern may be formed at 1130 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques.

Alternatively, the conductor pattern may be formed at 1130 using a lift-off process. Photoresist may be deposited over the piezoelectric plate. and patterned to define the conductor pattern. The conductor layer and, optionally, one or more other layers may be deposited in sequence over the surface of the piezoelectric plate. The photoresist may then be removed, which removes the excess material, leaving the conductor pattern.

In a second variation of the process 1100, one or more cavities are formed in the back side of the substrate at 1110B. A separate cavity may be formed for each resonator in a filter device. The one or more cavities may be formed using an anisotropic or orientation-dependent dry or wet etch to open holes through the back side of the substrate to the piezoelectric plate. In this case, the resulting resonator devices will have a cross-section as shown in FIG. 1.

In a third variation of the process 1100, one or more cavities in the form of recesses in the substrate may be formed at 1110C by etching the substrate using an etchant introduced through openings in the piezoelectric plate. A separate cavity may be formed for each resonator in a filter device. The one or more cavities formed at 1110C will not penetrate through the substrate, and the resulting resonator devices will have a cross-section as shown in FIG. 3.

In all variations of the process 1100, the filter device is completed at 1160. Actions that may occur at 1160 include depositing a passivation and tuning layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Any dielectric layer deposited at 1160 or elsewhere in the process 1100 is deposited over all resonators. Another action that may occur at 1160 is to tune the resonant frequencies of the resonators within the device by adding or removing metal or dielectric material from the front side of the device. After the filter device is completed, the process ends at 1195.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic resonator device comprising:
    a substrate having a surface;
    a single-crystal piezoelectric plate having front and back surfaces, the back surface attached to the surface of the substrate except for a portion of the piezoelectric plate forming a diaphragm that spans a cavity in the substrate; and
    a conductor pattern formed on the front surface of the piezoelectric plate, the conductor pattern including an interdigital transducer (IDTs), interleaved fingers of the IDT disposed on the diaphragm,
    wherein a pitch of the interleaved fingers and a mark of the interleaved fingers are set in combination such that a resonance frequency of the acoustic resonator is equal to a predetermined target frequency, and
    a ratio of the mark of the interleaved fingers to the pitch of the interleaved fingers is greater than or equal to 0.2 and less than or equal to 0.3.

2. The device of claim 1, wherein
    a ratio of the mark of the interleaved fingers to the pitch of the interleaved fingers is greater than or equal to 0.235 and less than or equal to 0.265.

3. The device of claim 1, wherein the diaphragm is contiguous with the piezoelectric plate around at least 50% of a perimeter of the cavity.

4. The device of claim 1 wherein the interleaved fingers of the IDT are aluminum with a thickness greater than or equal to 50 nm and less than or equal to 150 nm.

5. The device of claim 1, wherein the single-crystal piezoelectric plate and the IDT are configured such that a radio frequency signal applied to the IDT excites a shear primary acoustic mode within the diaphragm.

6. The device of claim 1, wherein the single-crystal piezoelectric plate is lithium niobate.

7. An acoustic filter device comprising:
    a substrate having a surface;
    a single-crystal piezoelectric plate having front and back surfaces, the back surface attached to the surface of the substrate except for portions of the piezoelectric plate forming a plurality of diaphragms spanning respective cavities in the substrate; and
    a conductor pattern formed on the front surface of the piezoelectric plate, the conductor pattern including interdigital transducers (IDTs) of a plurality of acoustic resonators, interleaved fingers of each IDT disposed on a respective diaphragm from the plurality of diaphragms,
    wherein, for each of the IDTs, a pitch of the interleaved fingers and a mark of the interleaved fingers are set in combination such that a resonance frequency of the respective acoustic resonator is equal to a respective predetermined target frequency, and
    for one or more of the IDTs, a ratio of the mark of the interleaved fingers to the pitch of the interleaved fingers is greater than or equal to 0.2 and less than or equal to 0.3.

8. The device of claim 7, wherein
    for one or more of the IDTs, a ratio of the mark of the interleaved fingers to the pitch of the interleaved fingers is greater than or equal to 0.235 and less than or equal to 0.265.

9. The device of claim 7, wherein the single-crystal piezoelectric plate is lithium niobate.

10. The device of claim 7, wherein each of the plurality of diaphragms is contiguous with the piezoelectric plate around at least 50% of a perimeter of the cavity.

11. The device of claim 7 wherein the interleaved fingers of all of the IDTs are aluminum with a thickness greater than or equal to 50 nm and less than or equal to 150 nm.

12. The device of claim 7, wherein the single-crystal piezoelectric plate and the plurality of IDTs are configured such that respective radio frequency signals applied to the plurality of IDTs excite respective shear primary acoustic modes within the respective diaphragms.

13. A method of fabricating an acoustic resonator device, comprising:
    bonding a back surface of a single-crystal piezoelectric plate to a surface of a substrate, a portion of the piezoelectric plate forming a diaphragm that spans a cavity in the substrate; and
    forming a conductor pattern on a front surf ace of the piezoelectric plate, the conductor pattern comprising an interdigital transducers (IDT), interleaved fingers of the IDT disposed on the diaphragm; and
    wherein a pitch of the interleaved fingers and a mark of the interleaved fingers are set in combination such that a resonance frequency of the acoustic resonator is equal to a predetermined target frequency, and
    a ratio of the mark of the interleaved fingers to the pitch of the interleaved fingers is greater than or equal to 0.2 and less than or equal to 0.3.

14. The method of claim 13, wherein
    a ratio of the mark of the interleaved fingers to the pitch of the interleaved fingers is greater than or equal to 0.235 and less than or equal to 0.265.

15. The method of claim 13, wherein the single-crystal piezoelectric plate and the IDT are configured such that a radio frequency signal applied to the IDT excites a shear primary acoustic mode within the diaphragm.

16. The method of claim 13, wherein the single-crystal piezoelectric plate is lithium niobate.

17. The method of claim 13, wherein the diaphragm is contiguous with the piezoelectric plate around at least 50% of a perimeter of the cavity.

18. The method of claim 13, wherein the interleaved fingers of the IDT are aluminum with a thickness greater than or equal to 50 nm and less than or equal to 150 nm.

* * * * *